(12) United States Patent
Bains

(10) Patent No.: US 8,909,856 B2
(45) Date of Patent: Dec. 9, 2014

(54) FAST EXIT FROM SELF-REFRESH STATE OF A MEMORY DEVICE

(71) Applicant: Kuljit S. Bains, Olympia, WA (US)

(72) Inventor: Kuljit S. Bains, Olympia, WA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/784,356

(22) Filed: Mar. 4, 2013

(65) Prior Publication Data

US 2013/0185499 A1 Jul. 18, 2013

Related U.S. Application Data

(63) Continuation of application No. 12/752,918, filed on Apr. 1, 2010, now Pat. No. 8,392,650.

(51) Int. Cl.
*G06F 13/00* (2006.01)
*G11C 11/406* (2006.01)
*G11C 7/22* (2006.01)

(52) U.S. Cl.
CPC ............ *G11C 11/40615* (2013.01); *G11C 7/22* (2013.01); *G11C 7/222* (2013.01); *G11C 11/406* (2013.01); *G11C 2207/2227* (2013.01); *G11C 2211/4067* (2013.01)
USPC .......................................... 711/106

(58) Field of Classification Search
None
See application file for complete search history.

(56) References Cited

U.S. PATENT DOCUMENTS

| 5,365,487 | A | 11/1994 | Patel et al. |
| 5,793,776 | A | 8/1998 | Qureshi et al. |
| 6,226,709 | B1 | 5/2001 | Goodwin et al. |
| 6,311,250 | B1 | 10/2001 | Kishino |
| 6,788,606 | B2 | 9/2004 | Fibranz et al. |
| 7,454,586 | B2 * | 11/2008 | Shi et al. ...................... 711/167 |
| 7,482,856 | B2 | 1/2009 | Lee |
| 7,894,627 | B2 | 2/2011 | Lang et al. |
| 2002/0042902 | A1 | 4/2002 | Yamamoto et al. |
| 2002/0141267 | A1 | 10/2002 | Choi |
| 2002/0191467 | A1 | 12/2002 | Matsumoto et al. |
| 2002/0191480 | A1 | 12/2002 | Matsumoto et al. |
| 2003/0182493 | A1 * | 9/2003 | Frame et al. .................. 711/100 |

(Continued)

FOREIGN PATENT DOCUMENTS

| DE | 103 41 556 | 6/2004 |
| JP | 5314766 | 11/1993 |
| WO | WO-98/25271 | 6/1998 |

OTHER PUBLICATIONS

Office Action from United Kingdom Application No. 1104300.7 mailed Jun. 24, 2011, 5 pages.

(Continued)

*Primary Examiner* — Sean D Rossiter
(74) *Attorney, Agent, or Firm* — Blakely, Sokoloff, Taylor & Zafman LLP

(57) ABSTRACT

A system provides for a signal to indicate when a memory device exits from self-refresh. Thus, substantially at the same time (before or after) the memory device exits self-refresh, an indicator signal can be triggered to indicate normal operation or standard refresh operation and normal memory access of the memory device. A memory controller can access the indicator signal to determine whether the memory device is in self-refresh. Thus, the memory controller can more carefully manage the timing of sending a command to the memory device while reducing the delay time typically associated with detecting a self-refresh condition.

20 Claims, 5 Drawing Sheets

(56) References Cited

U.S. PATENT DOCUMENTS

| | | |
|---|---|---|
| 2004/0078611 A1 | 4/2004 | Hoehler |
| 2004/0093461 A1* | 5/2004 | Kim .................. 711/106 |
| 2006/0104139 A1 | 5/2006 | Hur et al. |
| 2006/0143372 A1* | 6/2006 | Walker et al. .......... 711/106 |
| 2006/0221748 A1 | 10/2006 | Kinsley et al. |
| 2006/0259804 A1 | 11/2006 | Fry |
| 2007/0007992 A1 | 1/2007 | Bains et al. |
| 2007/0061614 A1 | 3/2007 | Choi |
| 2007/0106838 A1 | 5/2007 | Choi |
| 2007/0162689 A1 | 7/2007 | Choi |
| 2008/0028137 A1 | 1/2008 | Schakel et al. |
| 2009/0164846 A1 | 6/2009 | Foster, Sr. et al. |
| 2010/0162020 A1* | 6/2010 | Maule et al. ............ 713/324 |
| 2010/0174955 A1 | 7/2010 | Carnevale et al. |
| 2011/0055671 A1* | 3/2011 | Kim et al. ............... 714/800 |
| 2011/0101938 A1 | 5/2011 | Ma et al. |
| 2011/0131432 A1 | 6/2011 | Berke et al. |
| 2011/0179221 A1 | 7/2011 | Pax |
| 2011/0219182 A1* | 9/2011 | Farrell ..................... 711/106 |
| 2011/0225465 A1* | 9/2011 | Blackmon et al. ....... 714/54 |
| 2011/0246713 A1 | 10/2011 | Bains |
| 2011/0252193 A1 | 10/2011 | Bains |
| 2012/0079182 A1* | 3/2012 | Bains ....................... 711/106 |
| 2012/0147684 A1 | 6/2012 | Schakel et al. |
| 2012/0331220 A1* | 12/2012 | Bains ....................... 711/106 |
| 2013/0151768 A1* | 6/2013 | Farrell ..................... 711/106 |
| 2014/0211583 A1* | 7/2014 | Fujisawa .................. 365/222 |

OTHER PUBLICATIONS

Office Action from U.S. Appl. No. 12/752,918 mailed May 31, 2012, 19 pages.

Office Action from United Kingdom Application No. GB1104300.7 mailed Jul. 20, 2012, 5 pages.

Office Action from German Application No. 10 2011 014 587.7 mailed Jul. 2 2012, 7 pages.

Office Action from Korean Application No. 10-2011-29390 mailed Aug. 21, 2012, 3 pages.

Office Action for U.S. Appl. No. 12/758,667 dated Aug. 2, 2012, 19 pages.

Office Action for Application No. 1106129.8 dated Jul. 28, 2011, 7 pages.

Office Action for Application No. 10-2011-33902 dated Sep. 11, 2012, 8 pages.

Notice of Allowance from U.S. Appl. No. 12/752,918 mailed Nov. 1, 2012, 10 pages.

Office Action for U.S. Appl. No. 12/758,667 dated Jan. 4, 2013, 21 pages.

Actel Corporation, "Termination of the Vpp and Mode Pin for RH1020 and RH1280 Devices in a Radiation Environment", Oct. 2001, 4 pages.

\* cited by examiner

FAST EXIT FROM SELF-REFRESH STATE OF A MEMORY DEVICE

CROSS-REFERENCE TO RELATED APPLICATION

This application is a Continuation of and claims benefit of priority of U.S. patent application Ser. No. 12/752,918 filed on Apr. 1, 2010, entitled "FAST EXIT FROM SELF-REFRESH STATE OF A MEMORY DEVICE," which issued as U.S. Pat. No. 8,392,650 on Mar. 5, 2013.

FIELD

Embodiments of the invention are generally related to memory devices, and more particularly to indicating the exit of a memory device from self-refresh state.

COPYRIGHT NOTICE/PERMISSION

Portions of the disclosure of this patent document may contain material that is subject to copyright protection. The copyright owner has no objection to the reproduction by anyone of the patent document or the patent disclosure as it appears in the Patent and Trademark Office patent file or records, but otherwise reserves all copyright rights whatsoever. The copyright notice applies to all data as described below, and in the accompanying drawings hereto, as well as to any software described below: Copyright© 2010, Intel Corporation, All Rights Reserved.

BACKGROUND

Memory devices find ubiquitous use in computing devices. Dynamic random access memory (DRAM) is commonly used as working memory in computing devices. The working memory is often volatile (it loses state if power is interrupted to the system), and provides temporary storage for data and programs (code) to be accessed and executed by the system processor(s).

There are multiple types and variations of DRAM (one example being synchronous DRAM (SDRAM)). Being dynamic, DRAM requires continuous or regular refreshing of the data bits stored in the memory device. The refreshing is generally controlled by a memory controller, which periodically accesses the data bits in the memory device. DRAMs typically also have a self-refresh mode, which reduces power consumption by the memory device. In self-refresh, all internal clocks are typically turned off within the memory device, as well as input channels except CKE (clock enable), which is traditionally a unidirectional signal used by the memory controller to trigger self-refresh.

Although the memory controller triggers self-refresh with the CKE, self-refresh is typically controlled internally to the memory device, which means the memory controller does not have visibility into when the self-refresh actually begins and ends. As a result, if the memory controller access the memory device and gets no response, the memory controller must traditionally assume the memory device is in self-refresh and wait for the refresh cycle time (tRFC) plus an additional guard band time (e.g., 10 ns) before sending a command. For a 4 Gbit device, tRFC is expected to be in the range of 300 ns; but tRFC approximately doubles for doubling of device density. Thus, the delay for the memory controller to send a command continues to increase, and may produce less desirable performance.

FIG. 1 is a timing diagram of an embodiment of a prior art system with a self-refresh mode. Diagram 100 represents various signals present in known systems. Diagram 100 represents signals within a memory device, and specifically a memory device with a self-refresh mode. The clock signal (CK) is illustrated with various timing points (T0, T1, T2, . . . ) illustrated at the rising edge of the clock. Clock enable (CKE) is a unidirectional signal triggered by a memory controller to direct the memory device to enter self-refresh. The entering and exiting of self-refresh is controlled by the memory device itself; thus, actual timing of when and how long the memory device enters into self-refresh is not visible to the memory controller.

As shown, the command signal (CMD) illustrates a nop (no operation) at T0, and assumes that a self-refresh enable (SRE) command is issued at approximately T1. Another nop is issued, and the memory device enters self-refresh within a self-refresh enable clock count (tCKSRE). The memory device takes the memory device out of self-refresh prior to a delay that would cause a risk of loss of data within the memory. The amount of time for the self-refresh exit (SRX) command to be generated is within the self-refresh exit clock count (tCKSRX). The timing of SRX may coincide closely with the memory controller re-enabling the clock by switching CKE.

The first command after SRX (Tc1) is a nop (Td0). After a period of time tXS (shown at Te0), a valid command can be issued, if the command does not require a locked DLL. The value of tXS is (tRFC+guard band). The first valid command that can be issued after self-refresh exit is after a period of time tXSDLL (shown at Tf0). It will be understood from the time breaks, as well as in general that diagram 100 is not necessarily shown to scale.

BRIEF DESCRIPTION OF THE DRAWINGS

The following description includes discussion of figures having illustrations given by way of example of implementations of embodiments of the invention. The drawings should be understood by way of example, and not by way of limitation. As used herein, references to one or more "embodiments" are to be understood as describing a particular feature, structure, or characteristic included in at least one implementation of the invention. Thus, phrases such as "in one embodiment" or "in an alternate embodiment" appearing herein describe various embodiments and implementations of the invention, and do not necessarily all refer to the same embodiment. However, they are also not necessarily mutually exclusive.

Figure 1:
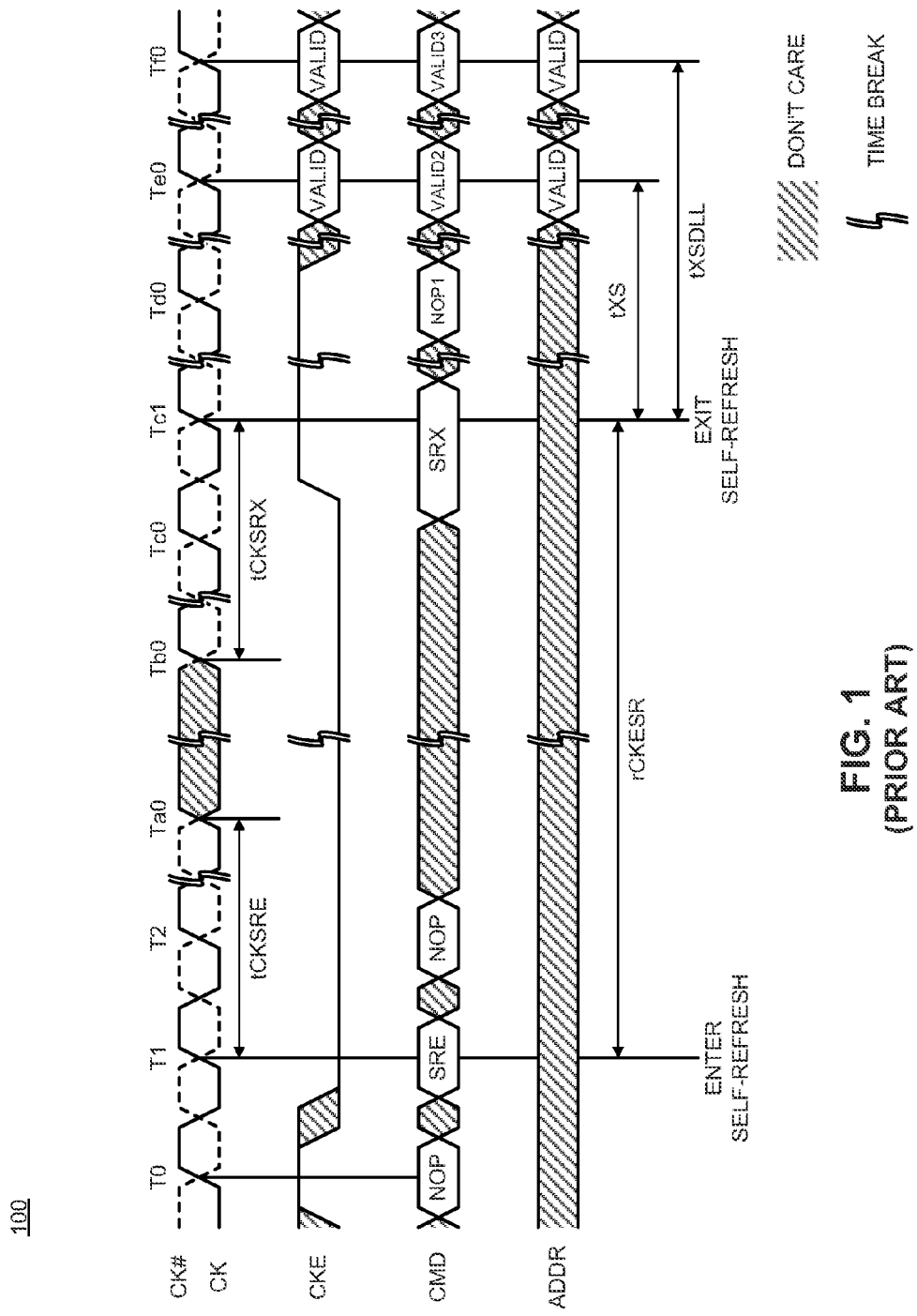
FIG. 1 is a timing diagram of an embodiment of a prior art system with a self-refresh mode.

Descriptions of certain details and implementations follow, including a description of the figures, which may depict some or all of the embodiments described below, as well as discussing other potential embodiments or implementations of the inventive concepts presented herein. An overview of embodiments of the invention is provided below, followed by a more detailed description with reference to the drawings.

DETAILED DESCRIPTION

As described herein, a system allows provides a self-refresh indicator signal to indicate self-refresh state changes. Additionally, by use of the signal, the exit time from self-refresh for the memory device can be improved. The self-refresh indicator signal is a signal produced by the memory device itself, and provides indications corresponding to a self-refresh state change. Thus, the memory device that controls the self-refresh state changes produces a self-refresh status indicator that can be detected by the memory controller. Self-refresh or low power operation of the memory device disables a clock signal within the memory device to temporarily suspend operation of the memory device. Memory access operations of the memory device are temporarily suspended in self-refresh mode, and are resumed when the memory device exits self-refresh to a standard refresh mode (which is the normal or standard operation of the memory device).

In one embodiment, the self-refresh state change indicator signal can be triggered in response to the memory device exiting or entering self-refresh, or the indicator signal could be triggered before or at substantially the same time as the memory device entering or exiting self-refresh. As a practical matter, a memory controller knows when a memory device enters self-refresh because the memory controller triggers self-refresh in the memory device; thus, an indication of self-refresh exit is generally expected to be more valuable information than an indication of entering self-refresh. As used herein, triggering, switching, setting, generating a signal, or other phrases indicating the producing of a self-refresh signal by the memory device are "in response to" the exiting of self-refresh if one occurs substantially in response to the other. The memory controller can access or receive the indicator signal to determine whether the memory device is in self-refresh. Thus, the delay associated with the memory controller not knowing what state the memory device is in can be significantly reduced.

If the memory controller determines that the memory device is not in self-refresh, the memory controller selects a wait time only equal to a guard band or other minimum required time between commands for the memory device. If the memory controller determines the memory device is in self-refresh, the memory controller could select a wait time according to a variety of different configurations, and then check the self-refresh state again. For example, the memory controller could wait an entire refresh cycle time (tRFC), similar to what is traditionally done. As another example, the memory controller could continue to poll the self-refresh signal periodically, on a period less than tRFC (tPollCycle<tRFC). After a period of time, or substantially continuously, the memory controller can check or monitor the self-refresh signal to determine when to attempt to access the memory device (i.e., when the memory device exits self-refresh). Once the memory controller determines the memory device has exited self-refresh, it can wait a guard band time and issue a command. Thus, as described herein, a "fast" self-refresh exit is provided.

Figure 2:
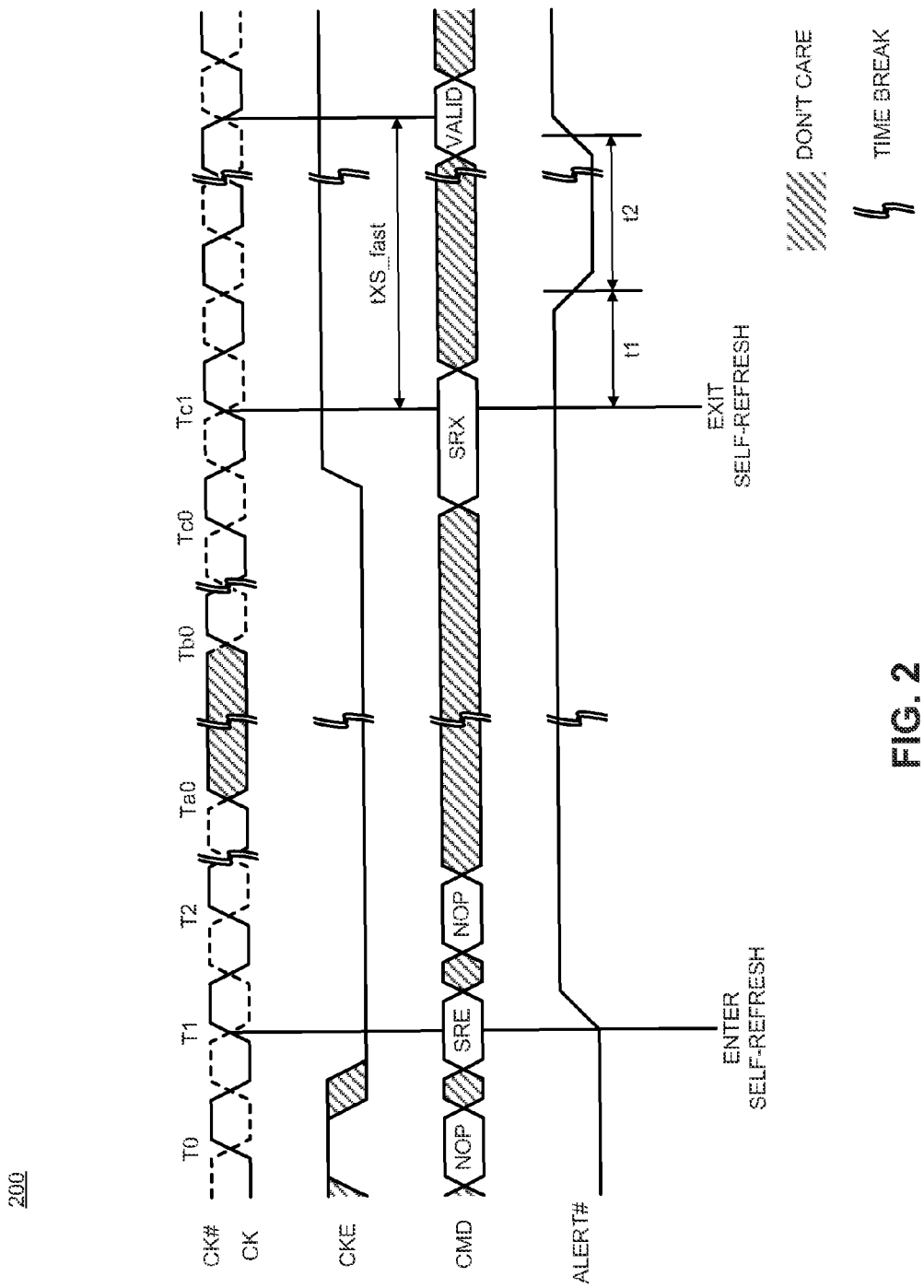
FIG. 2 is a timing diagram of an embodiment of a system with a self-refresh mode, including a self-refresh status indicator.

FIG. 2 is a timing diagram of an embodiment of a system with a self-refresh mode, including a self-refresh status indicator. Diagram 200 illustrates timing for various signals within a memory device that has a self-refresh mode. In one embodiment, the memory device is a DRAM compatible with DDR (dual data rate) standards, such as DDR3 or DDR4. As described in FIG. 2, the exit time from self-refresh or DRAM low power state is improved with an alert signal that indicates a self-refresh state to an associated memory controller. An associated memory controller or a corresponding memory controller with respect to a memory device is a memory controller that controls access to the memory device.

As mentioned above, self-refresh is managed internally by the memory device itself, which prevents the memory controller from having visibility of when self-refresh is exited. Whereas traditionally if a memory controller determined an associated memory device was in self-refresh, the memory controller would have to wait tRFC+a guard band (e.g., 10 ns) before issuing a command to the memory device, in one embodiment, the memory controller only waits for this maximum time if self-refresh is confirmed. In other embodiments, the memory controller may have other logic to reduce even the times the controller would have to wait the maximum time. It will be understood that tRFC and the guard band time are device characteristics specific to particular memory devices, based on architecture and manufacturing.

In one embodiment, the exit time from self-refresh is improved with the use of ALERT#, which represents an inverted signal produced by the memory device. In one embodiment as illustrated, ALERT# is triggered to transition responsive to exiting self-refresh. Some time t1 occurs between the generation of the self-refresh exit command (SRX) and the edge transition of ALERT#. The time t1 is a maximum timing specification for the memory device. The signal may be kept low for some period of time t2, where tXS_fast is (t1+t2). In one embodiment, ALERT# may transition similarly on self-refresh enter and self-refresh exit, or may have reverse logic on enter and exit. Thus, while shown in diagram 200 as staying high until self-refresh exit, ALERT# could be triggered on self-refresh enter and self-refresh exit. Alternatively, in one embodiment, ALERT# could simply transition between high and low each time self-refresh is exited. Thus, a memory controller could compare a previously stored logic state of the self-refresh signal with a current signal state. It will be understood that such an implementation would require additional logic in the memory controller.

In one embodiment, the time of tXS_fast is the time until a valid command can be issued, which is a time that is no greater than tXS of a traditional system (such as shown in diagram 100). In most cases, tXS_fast will be less than tXS. Newer memory devices, such as those that are compatible with DDR4, may have defined modes of DLL bypass that allow asynchronous operation to the memory device while the DLL is locking in the background. Such DLL bypass allows operation to the memory device (including reads) before the tXSDLL delay.

As shown in diagram 200, tXS_fast is a reduced self-refresh exit time that allows the first valid command can be issued before tXS. If there is an ongoing refresh in the memory device core, the memory device asserts the ALERT# signal after a delay of t1. At the completion of the refresh, the memory device de-asserts the ALERT# signal. The minimum value of tXS_fast is t1 and the maximum value is always less than tXS.

In one embodiment, fast exit mode is enabled or disabled in a memory device. For example, a configuration bit can be defined to enable the fast exit mode. If the bit is disabled, the memory controller can use tXS timings as in traditional systems (such as a DDR3 timing in accordance with diagram 100). When fast exit is disabled, the memory device does not indicate the self-refresh status using the ALERT# (or equivalent) signal. When the configuration bit is enabled, the memory device can provide a signal to the memory controller if self-refresh is ongoing after a self-refresh command is received.

While certain details have been described with specific reference to FIG. 2, it will be understood that the details may provide non-limiting examples. In general, a memory device with a self-refresh mode (e.g., any of a variety of DRAM devices) asserts a self-refresh indicator signal to indicate self-refresh exit, self-refresh enter, or both.

As mentioned above, the memory controller checks to determine whether a self-refresh indicator indicates that the memory device is in self-refresh. The determination could be performed prior to an access by the memory controller to the memory device. Various configurations could be used, such as but not limited to, the memory controller first attempting access and then checking the self-refresh signal if access is unsuccessful, checking the self-refresh signal prior to any attempt to access the memory device, checking the self-refresh signal prior to a one attempt to access the memory device but not checking again if the memory device is found to be in self-refresh, or other combinations.

In normal operation, a memory controller may attempt to access the memory device, but not receive a response as expected. In such a situation, memory controllers are programmed or configured to assume the memory device is in self-refresh, and delays the full expected refresh cycle plus exit time. Some determinations are actually "false positives," where the memory device is not really in self-refresh. However, the memory controller traditionally has no way of knowing whether a failed access is a false positive, or an actual self-refresh condition of the memory device. With the self-refresh indicator discussed herein, the memory controller can determine by an actual signal generated by the memory device whether or not the memory device is in self-refresh, which should operate to reduce such false positives.

In one embodiment, the memory controller awaits for an interrupt trigger on a changing edge of the self-refresh signal. The self-refresh signal could be a simple binary signal, having a logic high indicating self-refresh, and a logic low indicating a standard refresh mode of the memory device. It will be understood that a "logic" high and a "logic" low may or may not correspond to voltage high and low on the signal, but could be inverted. More complex communication could also be employed, such as the memory device triggering an impulse signal at each state change, or triggering a particular edge (e.g., falling or rising) before changing the signal to a voltage value for a period of time.

It will be understood that different wait times and different communication patterns would require programming or configuring the memory controller and/or the memory device with different logic, some of which may be more complex than other logic. Thus, the skilled reader will understand the possible trade-off between complexity of logic and the timing of indicating the self-refresh state change to the memory controller to enable the memory controller to determine whether or not to send a command to the memory device.

In one embodiment, the memory device may initiate a self-refresh timer when entering self-refresh. Such a timer can operate to indicate the length of self-refresh. Thus, the memory device may exit self-refresh responsive to the timer. In one embodiment, CKE is a bi-directional channel, where the memory controller generally controls the signal, and the memory device drives the signal to indicate a self-refresh state transition. In such an implementation, the self-refresh timer can be used to indicate when the memory device should drive CKE.

As mentioned above, the self-refresh status indicator is driven by the memory device itself. Triggering the self-refresh state indicator can be performed by setting a pin of the memory device, or sending a self-refresh status message to the memory controller. The message may be sent over a channel not present in DDR3 or previous standards. Similarly, the pin on which an ALERT signal is triggered may be different from previous standards. Alternatively, as mentioned above, CKE or another signal pin on the memory device could be made to be bidirectional instead of unidirectional, and provide a mechanism for the memory device to indicate the self-refresh status.

As described in more detail below, in one embodiment, a memory device may consist of various memory resources, each of which may be separately able to perform self-refresh, and indicate the state for each separate resource. Such implementations may be desirable when system resources are larger than needed to provide desired performance, or as part of a power conservation scheme where access to certain memory resources is temporarily switched off, trading performance for power savings. Thus, reference herein to a memory device performing any operation related to self-refresh may also be understood as having separate memory resources perform the operation. Such an implementation would require additional logic in a memory controller, and/or separate memory controllers for the different resources.

Figure 3:
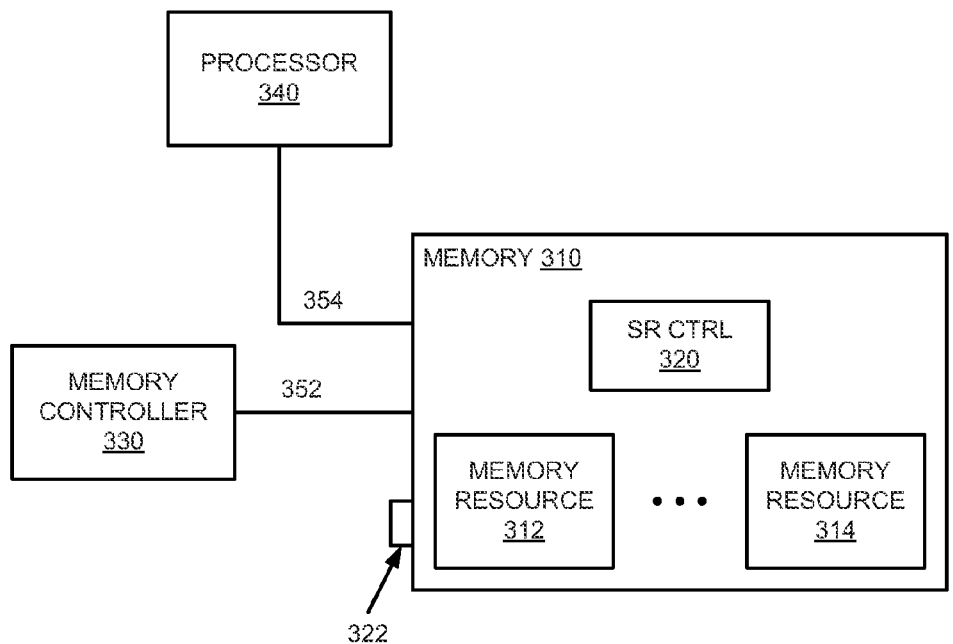
FIG. 3 is a block diagram of an embodiment of a system having a memory device with a self-refresh status indicator.

FIG. 3 is a block diagram of an embodiment of a system having a memory device with a self-refresh status indicator. System 300 represents any of a number of computing devices that may include a memory device with a self-refresh mode. Such computing devices may include servers, desktops, laptops, mobile devices, smartphones, gaming devices, and others. System 300 includes memory 310, which is a memory device according to any embodiment described herein and includes one or more memory resources 312-314.

Memory resources 312-314 represent the resources on which the data is stored for memory 310. In one embodiment, the memory resources are separate memory channels, memory banks, memory groups, or other similar separation. The logic required to implement any separate beyond that of memory channels may prevent any separation greater than separate channels in many practical implementations. Memory 310 further includes self-refresh control (SR CTRL) 320, which represents hardware and/or software logic within memory 310 to implement self-refresh. As mentioned above, self-refresh is administered within the memory device itself, which includes SR control 320 to implement the state changes and trigger the self-refresh status indicator.

In one embodiment, memory 310 includes pin 322, which is controlled by SR control 320 to indicate a self-refresh state change. While not specifically shown in system 300, it will be understood that memory controller 330 is connected to pin 322 to determine via the pin whether memory 310 is in self-refresh.

Memory controller 330 includes standard logic (hardware and/or software) to control access to memory 310 as is understood in the art. Additionally, memory controller 330 includes logic to read and react to the self-refresh indicator generated by memory 310. Memory controller 330 is associated with memory 310 because it controls the access of memory 310. Memory controller 330 is shown connected to memory 310 via channel 352, which could be a single line channel, or a multi-line channel (e.g., a bus), or a combination. In one embodiment, pin 322 could be considered to be included within a connection of channel 352. Channel 352 enables memory controller 330 to access memory 310, as well as provide CKE to memory 310.

Processor 340 represents processing resources of system 300. While shown in the singular, it will be understood that processor 340 may include one or more processor devices, such as or including multi-core devices. Processor 340 accesses memory 310 over bus 354 to perform read and write operations. In one embodiment, bus 354 may be physically routed through memory controller 330, but is shown logically separate to represent the fact that access to memory 310 from processor 340 may not include certain functions present in memory controller 330 (such as self-refresh indicator checking).

Figure 4:
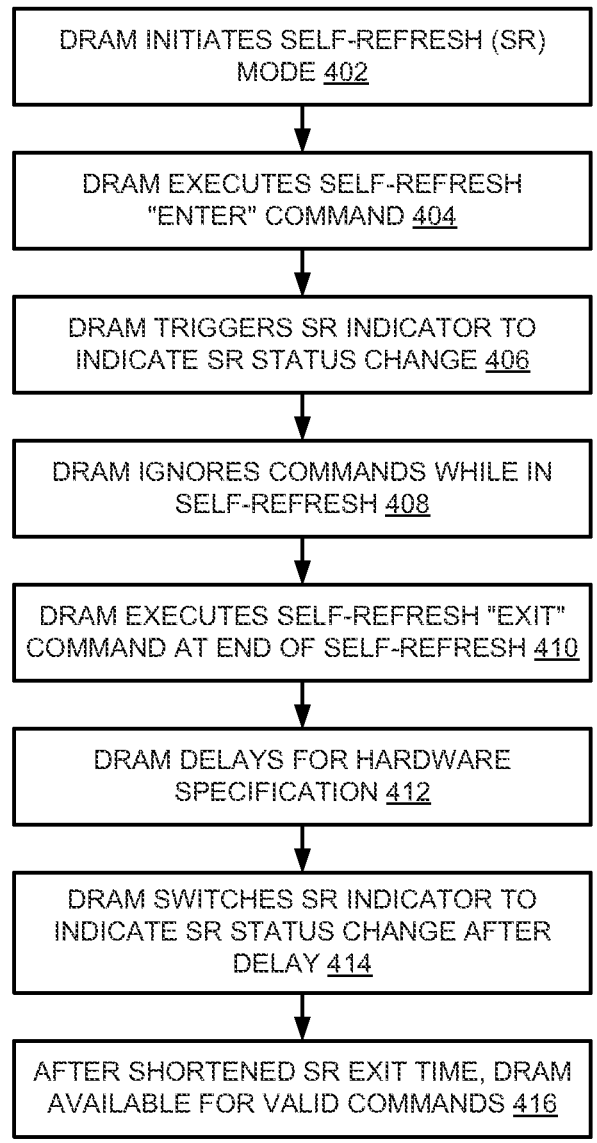
FIG. 4 is a flow diagram of an embodiment of a process for triggering a self-refresh state indicator responsive to a self-refresh mode state change.

FIG. 4 is a flow diagram of an embodiment of a process for triggering a self-refresh state indicator responsive to a self-refresh mode state change. Flow diagrams as illustrated herein provide examples of sequences of various process actions, which may be performed by processing logic that may include hardware, software, or a combination. Although shown in a particular sequence or order, unless otherwise specified, the order of the actions can be modified. Thus, the illustrated implementations should be understood only as an example, and the process can be performed in a different order, and some actions may be performed in parallel. Additionally, one or more operations can be omitted in various embodiments of the invention; thus, not all actions are required in every implementation. Other process flows are possible.

Reference below is made to a DRAM, which is to be understood as a memory device according to any embodiment described herein having a self-refresh mode. A memory controller associated with the DRAM initiates a self-refresh mode in the DRAM, 402, or initiates the entering of self-refresh. The DRAM executes a self-refresh "enter" command to turn off one or more clocks within the DRAM and suspend operation of the DRAM, 404. Access to the data stored in the DRAM is suspended while the memory device is suspended. In one embodiment, the DRAM triggers the self-refresh status indicator to indicate the self-refresh status change or the entering of self-refresh, 406. As discussed previously, there are many mechanisms that could be used by the DRAM to indicate the self-refresh status change.

The DRAM ignores commands while in self-refresh, 408. The DRAM executes a self-refresh "exit" command at the end of self-refresh, 410. In one embodiment, the DRAM delays for a hardware-specified amount of time, or an amount of time necessary to comply with hardware specifications of the DRAM, 412. The amount of time is an amount of time related to a timing specification defining how the DRAM behaves in certain conditions. In one embodiment, the DRAM triggers the self-refresh indicator to indicate the self-refresh status change (exiting self-refresh) after the delay, 414. After a shortened self-refresh exit time, the DRAM is available for valid commands, 416.

Figure 5:
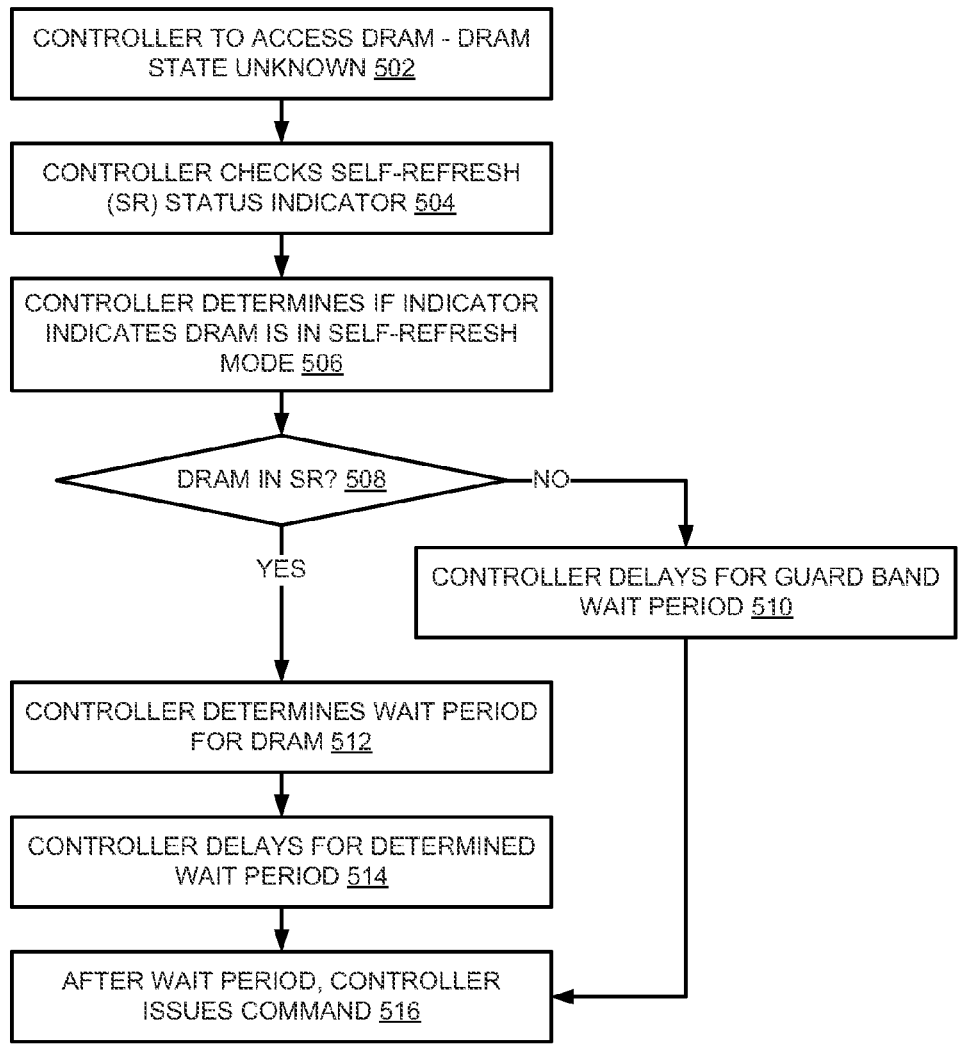
FIG. 5 is a flow diagram of an embodiment of a process for determining whether to access a memory device based on a self-refresh status indicator.

FIG. 5 is a flow diagram of an embodiment of a process for determining whether to access a memory device based on a self-refresh status indicator. The memory controller is to access the DRAM, and initially the state of the DRAM is unknown when the controller attempts to access it, 502. The DRAM state is unknown for reasons discussed above, that the operation of self-refresh is governed by the DRAM, and is not visible to the controller.

The controller checks a self-refresh status indicator of the DRAM to determine a self-refresh status of the DRAM, 504. In one embodiment, checking the status of the DRAM self-refresh indicator is not performed on-the-fly. Rather, for example, if a self-refresh status indicator is received previously, a register or buffer or other temporary value may be kept by the controller to indicate the latest known status. In the sense that the status may be buffered, the state of the DRAM may initially be "unknown" because the state indicator has not been checked. Thus, checking the status indicator could in one embodiment refer to checking a value stored internally regarding the status indicator.

The controller determines via checking the indicator whether the indicator indicates the DRAM is in self-refresh 506. If the DRAM is not in self-refresh, 508, the controller delays for a guard band wait period, 512, and then issues a command, 514. If the DRAM is in self-refresh, 508, the controller determines a wait period for the particular DRAM, and delays issuing a command to the DRAM, 510. The wait time may vary for the specific memory device. The wait time is affected by the device characteristics, such as device density. The wait period is generally configured into the associated controller. In one embodiment, the wait time is dependent upon an implementation selected for the system. For example, the controller may wait a maximum time to ensure that the DRAM exits self-refresh prior to attempting to send a command to the DRAM, or the controller may periodically poll the memory device to determine when it becomes available. The controller delays for the determined wait period and then checks the self-refresh status indicator again, 504. After the controller determines the DRAM is not in self-refresh, it delays for a guard band and issues a command to the DRAM, 512, 514.

To the extent various operations or functions are described herein, they may be described or defined as software code, instructions, configuration, and/or data. The content may be directly executable ("object" or "executable" form), source code, or difference code ("delta" or "patch" code). The software content of the embodiments described herein may be provided via an article of manufacture with the content stored thereon, or via a method of operating a communication interface to send data via the communication interface. A machine readable storage medium may cause a machine to perform the functions or operations described, and includes any mechanism that stores information in a form accessible by a machine (e.g., computing device, electronic system, etc.), such as recordable/non-recordable media (e.g., read only memory (ROM), random access memory (RAM), magnetic disk storage media, optical storage media, flash memory devices, etc.). A communication interface includes any mechanism that interfaces to any of a hardwired, wireless, optical, etc., medium to communicate to another device, such as a memory bus interface, a processor bus interface, an Internet connection, a disk controller, etc. The communication interface can be configured by providing configuration parameters and/or sending signals to prepare the communication interface to provide a data signal describing the software content. The communication interface can be accessed via one or more commands or signals sent to the communication interface.

Various components described herein may be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Besides what is described herein, various modifications may be made to the disclosed embodiments and implementations of the invention without departing from their scope. Therefore, the illustrations and examples herein should be construed in an illustrative, and not a restrictive sense. The scope of the invention should be measured solely by reference to the claims that follow.

What is claimed is:

1. A method comprising:
fast exiting from a self-refresh mode of memory resources to store data, wherein a fast exit time for the fast exiting is a time after an exit from self-refresh until a valid command can be issued to the memory resources, wherein the fast exit time is shorter than a refreshed cycle time (tRFC) for the memory resources plus an additional guard band time for the memory resources, wherein the fast exit time is based on periodically polling a self-refresh state indicator at a period of time.

2. The method of claim 1, further comprising setting a state of a configuration bit to enable the fast exiting.

3. The method of claim 1, wherein fast exiting includes changing from the self-refresh mode to a standard refresh mode of a memory device, where the self-refresh mode disables a clock within the memory device to temporarily suspend access operations of the memory device; and further comprising:
triggering a self-refresh state indicator of the memory device responsive to changing from the self-refresh state to the standard refresh state.

4. The method of claim 3, wherein changing is triggered by memory resource control logic coupled to the memory resources.

5. The method of claim 3, wherein changing from the self-refresh state to the standard refresh state comprises:
changing states in response to a self-refresh timer.

6. The method of claim 3, wherein triggering the self-refresh state indicator comprises:
setting a pin of the memory device.

7. The method of claim 3, wherein triggering the self-refresh state indicator comprises:
sending a self-refresh status message to a memory controller.

8. The method of claim 1, wherein the period of time is based on one of (1) a maximum timing specification for the memory resources, (2) a defined mode of DLL bypass that allows asynchronous operation of the memory resources while the DLL is locking in the background, (3) a hardware specific characteristic of the memory resources based on architecture and manufacturing of the memory resources, or (4) device density of the memory resources.

9. An apparatus comprising:
memory resources to store data; and
memory resource control logic coupled to the memory resources, the memory resource control logic to enable a fast exit from a self-refresh mode, a fast exit time is a time after an exit from self-refresh until a valid command can be issued to the memory resources, wherein the fast exit time is shorter than a refreshed cycle time (tRFC) for the memory resources plus an additional guard band time for the memory resources, wherein the fast exit time is based on periodically polling a self-refresh state indicator at a period of time.

10. The apparatus of claim 9, wherein a state of a configuration bit enables fast exit mode.

11. The apparatus of claim 9, further comprising:
an input control line to receive a clock signal; and
the control logic to:
change from the self-refresh state to a standard refresh state, where the self-refresh state disables the clock within the memory resources to temporarily suspend access operations of the memory resources; and
switch a self-refresh state indicator responsive to changing from the self-refresh state to the standard refresh state.

12. The apparatus of claim 11, wherein the memory resources comprise memory resources of a memory bank within a memory device.

13. The apparatus of claim 11, wherein the control logic to switch the self-refresh state indicator comprises:
control logic to set a pin of the apparatus to a logic state corresponding to the standard refresh state.

14. The apparatus of claim 11, wherein the control logic to switch the self-refresh indicator comprises:
control logic to send a self-refresh status message to a memory controller.

15. The apparatus of claim 9, wherein the period of time is based on one of (1) a maximum timing specification for the memory resources, (2) a defined mode of DLL bypass that allows asynchronous operation of the memory resources while the DLL is locking in the background, (3) a hardware specific characteristic of the memory resources based on architecture and manufacturing of the memory resources, or (4) a device density of the memory resources.

16. A system comprising:
a memory device having
memory resources to store data;
memory resource control logic coupled to the memory resources, the memory resource control logic to enable a fast exit from a self-refresh mode, a fast exit time is a time after an exit from self-refresh until a valid command can be issued to the memory resources, wherein the fast exit time is shorter than a refreshed cycle time (tRFC) for the memory resources plus an additional guard band time for the memory resources, wherein the fast exit time is based on periodically polling a self-refresh state indicator at a period of time; and
a memory controller to manage access to data stored on the memory device, the memory controller to:
determine whether to access the memory device by determining whether the self-refresh state indicator indicates the memory device is in a self-refresh state;
if the memory device is in the self-refresh state, select a self-refresh wait time;
otherwise, select a guard band wait time; where the self-refresh wait time indicates an amount of time a memory controller should wait before determining again whether the self-refresh state indicator indicates the memory device is in a self-refresh state, and the guard band wait time indicates a minimum time between commands sent to the memory device from a memory controller; and
send a command at the end of the guard band wait time.

17. The system of claim 16, wherein a state of a configuration bit enables fast exit mode.

18. The system of claim 16, further comprising:
an input control line to receive a clock signal; and
the control logic to:
change from the self-refresh state to a standard refresh state, where the self-refresh state disables the clock within the memory resources to temporarily suspend access operations of the memory resources; and
switch a self-refresh state indicator responsive to changing from the self-refresh state to the standard refresh state.

19. The system of claim 18, wherein the control logic to switch the self-refresh state indicator comprises:

control logic to set a pin of the apparatus to a logic state corresponding to the standard refresh state, wherein the pin comprises a bidirectional clock enable (CKE) channel, wherein the memory device drives the channel to indicate exit from self-refresh, and wherein otherwise the memory controller drives the channel; and wherein the memory controller to select the self-refresh wait time comprises:

the memory controller to select a wait time between performing polling attempts of the self-refresh state indicator to determine whether to access the memory device.

20. The system of claim 16, wherein the period of time is based on one of (1) a maximum timing specification for the memory resources, (2) a defined mode of DLL bypass that allows asynchronous operation of the memory resources while the DLL is locking in the background, (3) a hardware specific characteristic of the memory resources based on architecture and manufacturing of the memory resources, or (4) a device density of the memory resources.

\* \* \* \* \*